United States Patent [19]
Lenz et al.

[11] Patent Number: 6,069,806
[45] Date of Patent: May 30, 2000

[54] POWER SUPPLY

[75] Inventors: Helmut Lenz, Oberasbach; Robert Bleisteiner, Dormitz, both of Germany

[73] Assignee: Siemens Aktiengesellschaft, Munich, Germany

[21] Appl. No.: 09/039,227

[22] Filed: Mar. 16, 1998

[30] Foreign Application Priority Data

Mar. 17, 1997 [DE] Germany .......................... 197 11 017

[51] Int. Cl.[7] .............................. H02M 7/00; H02M 5/42
[52] U.S. Cl. .................... 363/70; 363/89; 363/67
[58] Field of Search ................. 363/70, 67, 53, 363/24, 25, 89, 17, 15, 84, 87

[56] References Cited

U.S. PATENT DOCUMENTS

| | | | |
|---|---|---|---|
| 4,030,018 | 6/1977 | Tsuboi ...................................... 318/227 |
| 4,672,528 | 6/1987 | Park et al. ................................ 363/98 |
| 4,805,078 | 2/1989 | Munz ....................................... 363/17 |
| 5,546,299 | 8/1996 | Lenz . | |
| 5,646,835 | 7/1997 | Katcha ..................................... 363/98 |
| 5,687,071 | 11/1997 | Debruyne et al. ...................... 363/127 |
| 5,691,607 | 11/1997 | Zawislak et al. ....................... 315/308 |

FOREIGN PATENT DOCUMENTS 0 224 198   6/1987   European Pat. Off. .
35 39 027   5/1987   Germany .

*Primary Examiner*—Peter S. Wong
*Assistant Examiner*—Rajnikani B. Patel
*Attorney, Agent, or Firm*—Hill & Simpson

[57] ABSTRACT

A power supply or converter has an AC-voltage source to which a number of rectifiers are connected, with at least one of the rectifiers having a switching stage by which, in a feedback mode, energy can be fed back to the AC-voltage source from a DC-voltage terminal and/or from a capacitor of the rectifier. Such an arrangement achieves an energy symmetry among a number of connected users, e.g. back-feeding output stages, with low losses and low cost in terms of circuitry.

19 Claims, 8 Drawing Sheets

POWER SUPPLY

BACKGROUND OF THE INVENTION

1. Field of the Invention

The present invention relates to a power supply converter of the type having rectifiers connected to an AC source to supply DC power to a number of coupled output stages. The invention is particularly directed to a converter suitable for a gradient amplifier of an NMR-tomography apparatus in which a number of power output stages are switched in series to drive a gradient coil.

2. Description of the Prior Art

German OS 43 04 517 discloses a power supply of this type. Two rectifiers are therein connected to an AC-voltage via respective isolating transformers. The rectifiers are able to convey energy to a respective power output stages via respective DC-terminals. The output terminals of the output stages are switched in series and drive a gradient coil.

In operation the output stages supply a regulated voltage of, for example, several hundred volts, to the gradient coil in order to periodically build up and dismantle a current of 300 A, for example. An exactly prescribed current curve is maintained which has a cycle duration of 20 ms, for example. During a cycle, considerable amounts of energy flow from the output stages to the coil and back again. In normal operation, each of the output stages respectively contributes to balancing the losses arising therein. Thus, in normal operation, energy flows via the rectifier from the AC-voltage source to one of the output stages and then further on to the gradient coil, this flow being averaged over the cycle duration (with no accounting for the blind current).

There are, however, other possible modes of operation, in which one output stage draws energy stored in the gradient coil while another output stage delivers this energy. This can be the case particularly when the output stages are driven differently or have different characteristics. For example, when the prescribed current curve has steep leading edges and flat trailing edges, and the output alternatively stages assume the functions of a constant load output stage and a peak load output stage, it is possible for the peak load output stage to be connected only during the steep leading edges of the current. The energy delivered to the gradient coil the peak load output stage is then fed back exclusively to the constant load output stage during the flatter trailing edges of the current. This can lead to an excessive loading (over-voltage) of a charging capacitor which is arranged in a DC-voltage intermediate circuit formed by the constant load output stage and the allocated rectifier. The power supply can be damaged by the over-voltage.

This kind of undesirable loading is also possible in other situations; for example, when the output stages are driven so that they deliver voltages of differing polarity. Deviations in the electrical characteristics of the output stages can also lead to a load transfer between the output stages even when the driving is the same.

To avoid an over-voltage in the individual DC-voltage intermediate circuits, German OS 43 04 517 teaches the use of discharging resistors as a primary alternative, these resistors being switched parallel to the charging capacitors. Such discharging resistors, however, considerably increase the energy consumption of the power supply and the dissipated heat which must be conducted away by cooling. As a second alternative, German OS 43 04 517 provides teaches the use of a switchable discharging means (DC-DC-converter) for energy distribution between the DC-voltage intermediate circuits. This type of discharging means is costly in terms of circuitry, however, especially when more than two output stages and rectifiers are provided.

German OS 35 39 027 teaches a rotary current rectifier with an electronically driveable switch parallel to each diode. The switch-on phases of the electronically driveable switch are driven synchronously with the conductive phase of the allocated, line-commutated diodes. The rectifier is provided for utilization in the drive circuitry in order to enable a backflow of the braking energy into the network in a braking operation.

European Application 0 224 198 disclosed a power convention with a bridge rectifier circuit with thyristors respectively connected with opposite polarity across each rectifier each in the bridge circuit. The thyristors are driven according to a pulse-width modulation process, in order to obtain a sinusoidal current flow with low harmonic distortion of the higher orders.

SUMMARY OF THE INVENTION

An object of the present invention to provide a power supply or converter in which energy can be balanced among a number of connected users—e.g. back-feeding output stages—with low losses and low expenditure of circuitry.

The above object is achieved in accordance with the principles of the present invention in a power supply having an AC voltage source to which a number of rectifiers are connected which, in normal operation, are fed by the AC voltage source and which convey energy respectively to a number of DC voltage terminals, respectively connected to an equal number of output stages, wherein at least one of the rectifiers includes a switching stage through which energy can be fed back from the connected DC voltage terminal, and/or from a capacitor of the rectifier, to the AC voltage source in a feedback mode, and wherein the AC voltage source is configured to take the energy which is flowing back from the aforementioned one of the rectifiers and to conduct this energy to at least one other of the rectifiers, and/or to a capacitor of the AC voltage source.

The invention is based on reversing an over-voltage in a DC-voltage intermediate circuit back to the common AC-voltage source via an appropriate switching stage. The back-fed energy is drawn again by the other users connected to the AC-voltage source. The desired symmetry of energy between arbitrarily many users thereby ensues independently and is achieved without necessitating costly circuits for direct connection to the DC-voltage intermediate circuit. "AC-voltage" is used herein as meaning any voltage with alternating voltage levels, even if a DC-voltage is superimposed thereon.

The switching stage preferably includes active switch elements which are respectively connected parallel to rectifier diodes (this term is intended to designate any type of rectifying component). Each switch element can be switched parallel to its allocated rectifier diode either directly or via an inductance. If such an inductance—e.g. an inductor—is provided, it preferably serves to limit the backflow of energy through the connected switch element in the feedback operation. The energy flow in normal operation preferably passes across the rectifier and beyond the inductance and thus is not affected by the inductance.

A drive circuit is preferably further provided to drive the switching stage. The drive circuit can be a single assembly or a number of separate assemblies. In an advantageous embodiment, the driving ensues independently of the operative state of the power supply (normal or feedback operation), i.e. according to a fixed time cycle, for example.

Each switch element preferably is switched into a conductive state independently of the operative state only at those times at which the allocated rectifier diode would be traversed by a current, given an assumed normal operation. Thus, in the actual normal operation, the switch elements have no effect (aside from the fact that they can take over a part of the current otherwise flowing through the rectifier diode). By contrast, in the feedback operation the energy backflow ensues via the switch elements opposite the conduction direction of the rectifier diodes.

The switch elements are preferably kept in a conductive state as long as possible, although certain safety times certainly should be maintained. The created DC-voltage is thus particularly stable (high stability of the power supply). In particular, the switch elements can be driven with minimal safety times and perfectly in-hase (but separated by 180° in pairs) if the drive circuit powers not only the switching stage, but also the active switch elements of a flow converter with mutually synchronized switching signals. In order to prevent an excessively high backflow of energy through a switching stage, however, it the safety times can be extendable beyond the minimum duration. This measure can be provided additionally or alternatively to the above-mentioned inductance in the feedback branch.

The rectifiers preferably are designed so that each rectifier diode also serves as a recovery diode for the active switch element connected thereto. Thus only a low additional components cost arises for the energy balancing function.

The energy conducted back to the AC-voltage source from a rectifier is inventively transmitted to at least one other connected rectifier or to a charging capacitor of the AC-voltage source. To this end, the AC-voltage source preferably includes a transformer with multiple secondary windings, to which rectifiers are respectfully connected. The transformer can be an individual transformer or a number of coupled transformers. To couple a number of transformers, their primary windings are preferably switched in a parallel fashion.

DESCRIPTION OF THE PREFERRED EMBODIMENTS

Figure 1:
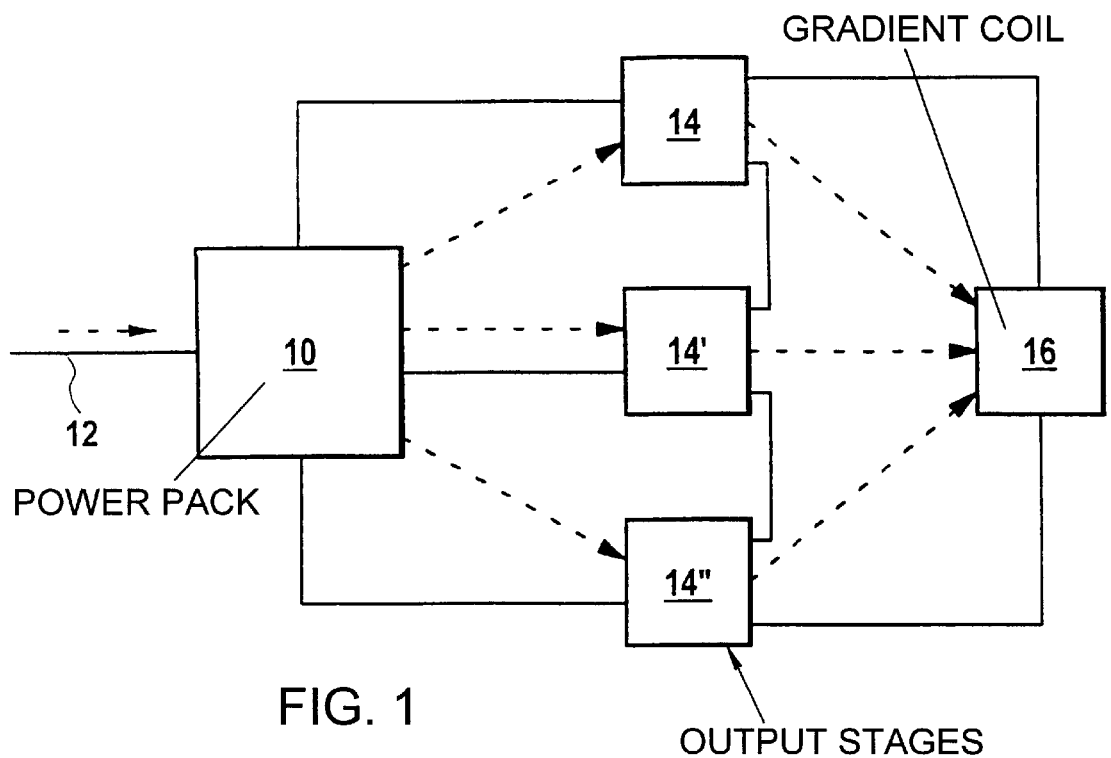
FIG. 1 and FIG. 2 are block diagrams of components of a gradient amplifier connected to a gradient coil respectively showing energy flow at different times during normal operation and in a feedback mode, respectively.
Figure 2:
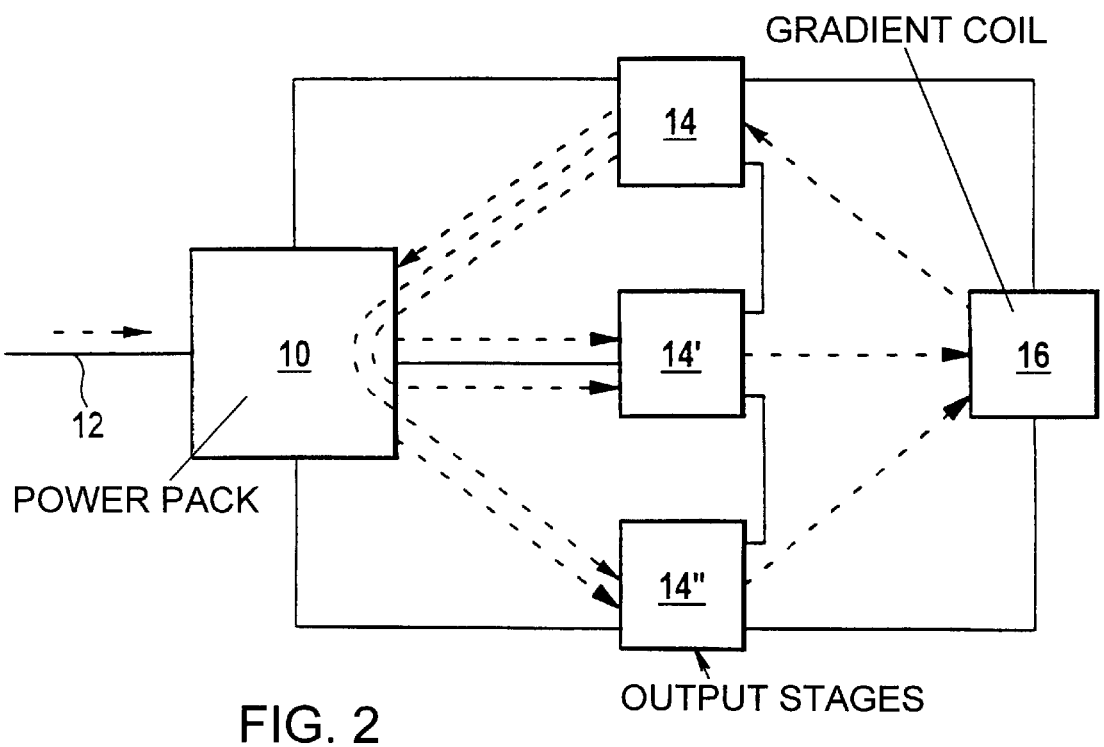

In FIG. 1 and FIG. 2, the solid lines represent electrical connections, while the dashed arrows symbolize the energy flow between the components. As used herein, "energy flow" means the energy flow averaged over a complete current cycle (without blind current portion). A current supply designed as a power pack 10 is connected to a network (mains) input line 12 at an arbitrary appropriate voltage source, e.g. the public utility current network. Three output stages 14, 14', 14" of the gradient amplifier are respectively supplied by the power pack 10 with a floating DC-voltage. The output stages 14, 14', 14" are serially switched at their outputs and are connected to an inductive load, in this case a gradient coil 16. An arbitrary number (i.e., not necessarily three) of connected output stages can be provided.

FIG. 1 depicts the energy flow which ensues in a normal operation, this flow being directed via the network input line 12 to the power pack 10, and from this to each of the output stages 14, 14', 14", and further on to the gradient coil 16.

FIG. 2 depicts the feedback operation for the example of the output stage 14. The output stage 14 receives energy from the gradient coil 16 and conducts this energy back to the power pack 10. The back-fed energy is conducted to the other output stages 14', 14" via the power pack 10. These output stages 14', 14" work in the normal operation, i.e. they deliver energy to the gradient coil 16.

Figure 3:
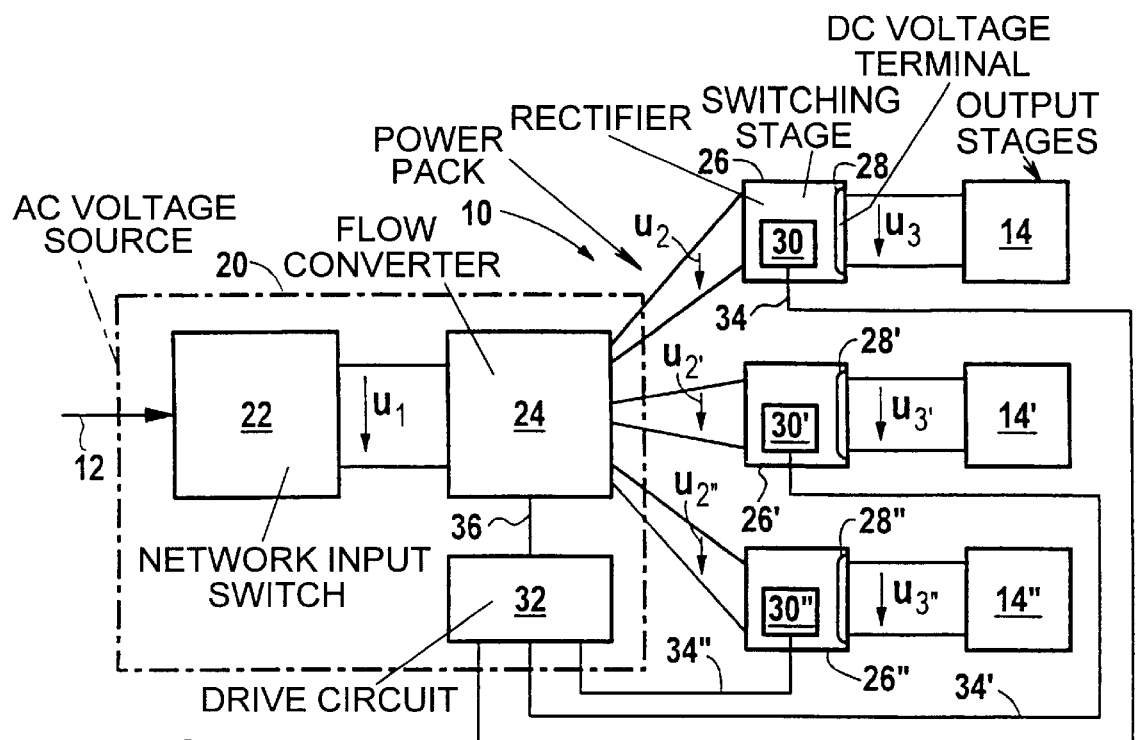
In FIG. 3 is a more detailed block diagram of the components shown in FIG. 1 and FIG. 2 modified in an exemplary embodiment of the invention.

The power pack 10 includes an AC-voltage source 20 with three floating outputs for AC-voltages $u_2$, $u_2'$, $u_2"$, as depicted in FIG. 3. A network input switch 22 of the AC voltage source 20 is connected to the network input line 12 and delivers a DC-voltage $u_1$ to a flow converter 24. The flow converter 24 creates the three AC-voltages $u_2$, $u_2'$, $u_2"$ across the rectifiers 26, 26', 26". Each rectifier 26, 26', 26" has a DC-voltage terminal 28, 28', 28" for a respective DC-voltage $u_3$, $u_3'$, $u_3"$. The DC-voltages $u_3$, $u_3'$, $u_3"$ serve as the supply voltages for the output stages 14, 14', 14". Switching stages 30, 30', 30" of the rectifiers 26, 26', 26" are connected to a drive circuit 32 via drive connections 34, 34', 34". Another drive connection 36 runs between the drive circuit 32 and the flow converter 24.

Figure 4:
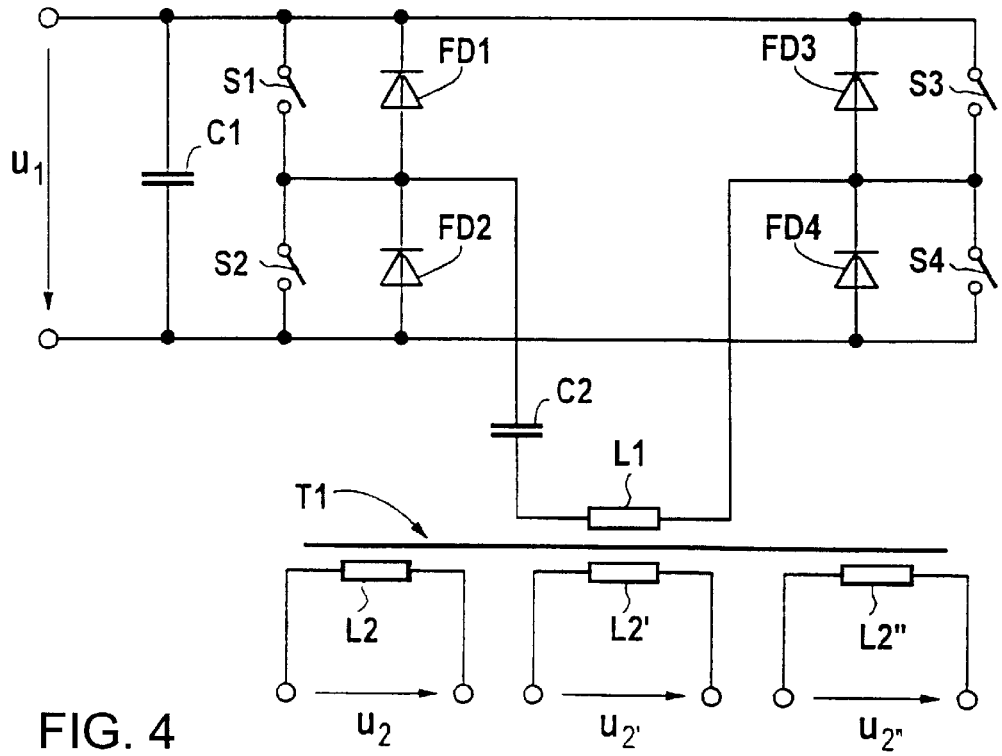
FIG. 4 and FIG. 5 respectively are circuit diagrams of two embodiments of a flow converter in accordance with the invention.

The network input switch 22 is known. In the simplest case, it is formed by only one rectifier for creating the DC-voltage $u_1$. A transformer for voltage adjustment and/or a switch for sinusoidal drawing of current from the network, and/or a high-frequency filter for increasing the electromagnetic compatibility can be connected in series to this rectifier, for example. In one variation, the network input switch 22 can be designed as a stabilizing power pack part. FIG. 4 depicts a full bridge circuit for the flow converter 24. A capacitor C1 is connected to the DC-voltage $u_1$ in order to smooth this voltage and to make available requisite power peaks. Two pairs of serially switched switch elements S1, S2, and S3, S4 form first and second bridge branches, respectively. Recovery diodes FD1–FD4 are connected in parallel with the switch elements S1–S4. A primary winding L1 of the transformer T1 is switched in series with the coupling capacitor C2 and is connected to the bridge branch.

In the exemplary embodiment described herein, the transformer T1 has three separate secondary windings L2, L2', L2" for DC-voltages $u_2$, $u_2'$, $u_2"$. In one variation, the transformer is formed by a number of transformers with primary sides which are switched in a parallel fashion. A combination of these embodiments is also possible. For example, the transformer can be formed by a number of transformers each with a number of secondary windings, which windings are switched at the primary sides of the transformers in a parallel fashion.

In the operation of the circuit according to FIG. 4, the voltage $u_1$ with alternating polarity is applied at the primary winding L1 of the transformer T1 causing the switch elements S1, S4 to be switched on (i.e., conducting) and the switch elements S2, S3 switched off (i.e., non-conducting), in an alternating fashion. The AC-voltages $u_2$, $u_2'$, $u_2''$ tapped at the secondary windings L2, L2', L2'' have a substantially rectangular curve, just like the voltage at the primary winding L1.

The coupling capacitor C2 prevents the buildup of a DC-current in the primary winding L1 when, for example, the drive signals for the switch elements S1–S4 are not perfectly balanced or when their switch delay times are not exactly the same. In one alternative, appropriate switching measures are provided to preclude such a DC-current from arising. In this case, the coupling capacitor C2 can be omitted.

Figure 5:
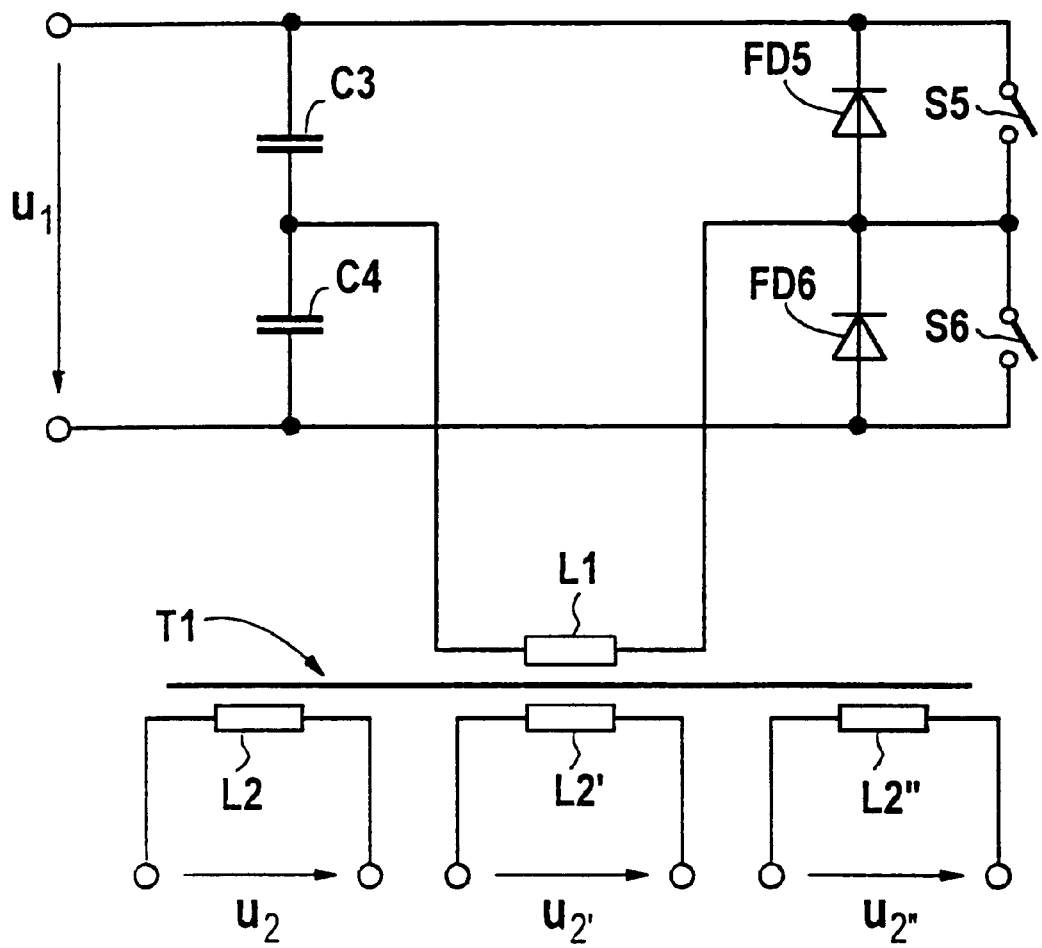

In the flow converter in the half-bridge circuit depicted in FIG. 5, a bridge branch is formed by the switch elements S5, S6 and recovery diodes FD5, FD6. In the other bridge branch, the switch elements and recovery diodes are replaced by two serially switched capacitors C3, C4. An additional coupling capacitor is not necessary therein.

In the operation of the circuit according to FIG. 5, if the switch elements S5, S6 are driven push-pull when the pulse-duty ratio is balanced, then a voltage $u_1/2$ is across the capacitors C3, C4. Accordingly, the primary winding L1 of the transformer T1 is also switched to $u_1/2$ with alternating polarity. The output voltages $u_2$, $u_2'$, $u_2''$ are rectangular as well.

The circuit for the flow converter 24 according to FIG. 4 or FIG. 5 has the advantage that, during energy feedback at the primary side of T1, the recovery diodes FD1–FD6 act as rectifier diodes. Thus, in a feedback mode, not only can the energy flow ensue over the secondary windings L2, L2', L2'' of the transformer T1 to other rectifiers 26, 26', 26'', but an energy flow also can ensue over the primary winding L1 and other elements of the flow converter 24 to the capacitor C1 (FIG. 4), or to the capacitors C3, C4 (FIG. 5). If this possibility is not employed (it is not absolutely necessary, since the energy balance between the output stages 14, 14', 14'' generally suffices without introduction of charging capacitors of the flow converter 24), then the construction of the flow converter 24 can also deviate from FIG. 4 and FIG. 5.

Figure 6:
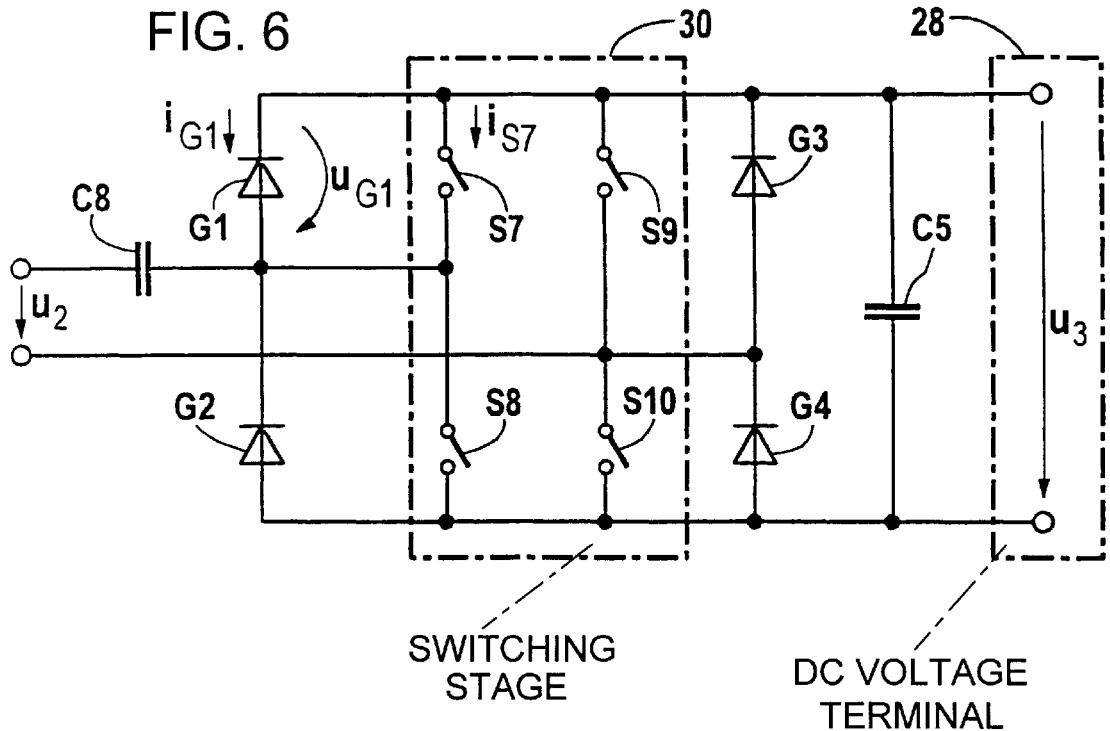
FIG. 6 and FIG. 7 respectively are circuit diagrams of two embodiments of a rectifier in accordance with the invention.

FIG. 6 depicts a full-bridge circuit for the rectifier 26 (as well as the rectifiers 26', 26''). The AC-voltage $u_2$ is across two rectifier bridge branches via a coupling capacitor C8, these branches having two serially switched rectifier diodes G1, G2, and G3, G4, respectively. In normal operation (i.e. in the energy flow depicted in FIG. 1) the voltage $u_2$ is full-wave rectified by this arrangement of the rectifier diodes G1–G4. The resulting DC-voltage $u_3$ reaches the maximum value of the AC-voltage $u_2$. The voltage $u_3$ is at the DC-voltage terminal 28 and is conducted to an output stage 14 (cf. FIG. 3).

Thus, a DC-voltage intermediate circuit is formed by the DC-voltage side of the rectifier 26 and by the output stage 14, a capacitor C5 being switched into this DC-voltage intermediate circuit as a charging capacitor. FIG. 6, the capacitor C5 is allocated to the rectifier 26; however, in an alternative embodiment it can be a component of the output stage 14. In another alternative the coupling capacitor C8 can be omitted, as mentioned above in connection with the coupling capacitor C2.

As shown in FIG. 6, the switching stage 30 of the rectifier 26 has four active switch elements S7–S10 which are connected in a parallel fashion to a respective rectifier diodes G1–G4. Bipolar transistors, FETs (Field Effect Transistors) or IGBTs (insulated gate bipolar transistors) can serve as switch elements S7–S10 (and likewise as the switch elements S1–S6). Alternatively, each switch element S1–S10, along with the allocated diodes FD1–FD4 and G1–G6 can be designed as FREDFETs, i.e., a field effect transistor to which a FRED (fast recovery epitaxial diode) is switched internally in a parallel fashion. Particularly at larger powers, thyristors (possibly with resetting means) or GTOs (gate turn-off thyristors) can serve as the switch elements S1–S10.

Figure 7:
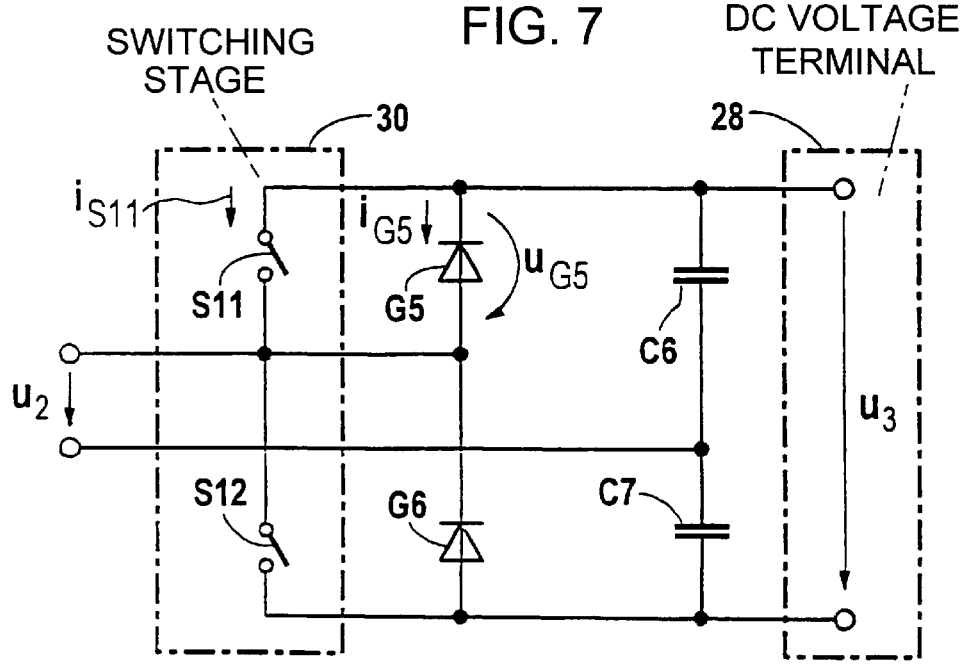

As shown in FIG. 7, in the half-bridge circuit (voltage doubling circuit) for the rectifier 26 (as well as for the rectifiers 26', 26''), two rectifier diodes G5, G6 are provided in one bridge branch, while the rectifier diodes and switch elements in the other bridge branch are replaced by two serially switched capacitors C6, C7. The switching stage 30 has two switch elements S11, S12 connected to the rectifier diodes G5, G6 in a parallel fashion, the switch elements S11, S12 can be designed like the switch elements S1–S10. The output voltage $u_3$ in this embodiment reaches the sum of the positive and negative maximum values of $u_2$. A coupling capacitor (as C8 in FIG. 6) is not necessary.

In the operation of the power supply, the switch elements S7–S10 in FIG. 6, or S11, S12 in FIG. 7, are appropriately driven by the drive circuit 32 via the connections 34, 34', 34'' (cf. FIG. 3), as is outlined in the introductory portion and more specifically explained below.

Figure 8:
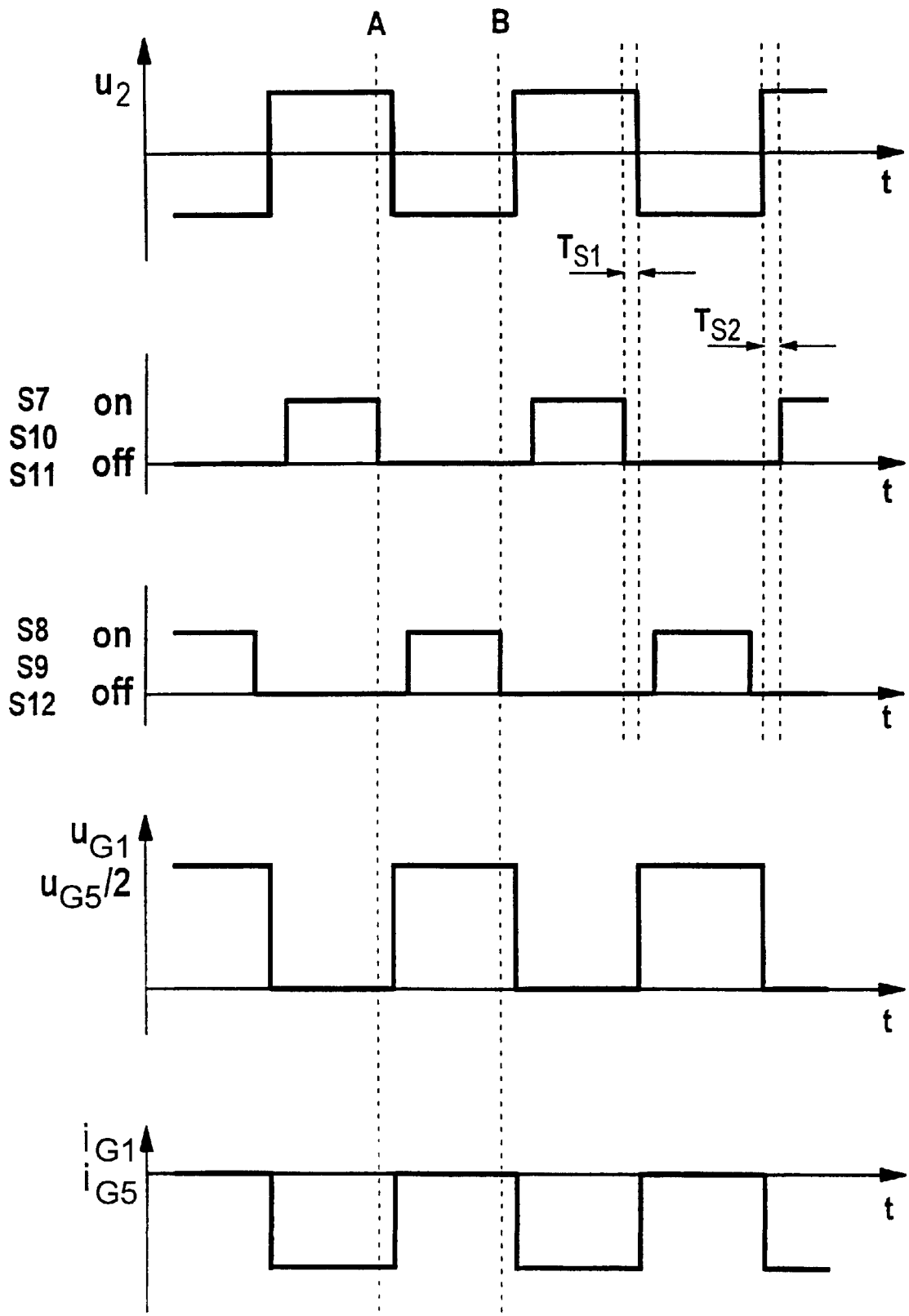
FIG. 8 and FIG. 9 show voltage-time and current-time diagrams during the operation of the exemplary embodiment depicted in FIG. 3.

FIG. 8 shows typical voltage and current curves in normal operation of the rectifier 26 (or respectively, the rectifiers 26', 26''). The input voltage $u_2$ (first line in FIG. 8) is a symmetrical, rectangular AC-voltage. The switch elements S7, S10 (or S11) are only shifted into a conductive state if a positive voltage $u_2$ is present (second line in FIG. 8). The trailing edge of the drive signal for the switch elements S7, S10 (or S11) precedes the trailing edge of $u_2$ by one safety time $T_{S1}$, and the leading edge of the drive signal follows the leading edge of $u_2$ by a safety time $T_{S2}$. During the safety times $T_{S1}$, $T_{S2}$, the switch elements S7, S10 (or S11) do not conduct.

The switch elements S8, S9 (or S12) are likewise driven with safety times and are only connected through when the voltage $u_2$ is negative (third line in FIG. 8). Because of this driving, each switch element S7–S12 conducts at most when the allocated rectifier diode G1–G6 is traversed by a current in normal operation. The switch element S7–S12 then can take over a part of the current flow through the rectifier diode G1–G6; however, the switch element has no function otherwise (in normal operation). As an example, the last two lines of FIG. 8 depict the voltage $U_{G1}$ at the rectifier diode G1 (or the half voltage $U_{G5}/2$ at G5) and the current flow $i_{G1}$ through the rectifier diode G1 (or the current flow $i_{G5}$ through G5).

Figure 9:
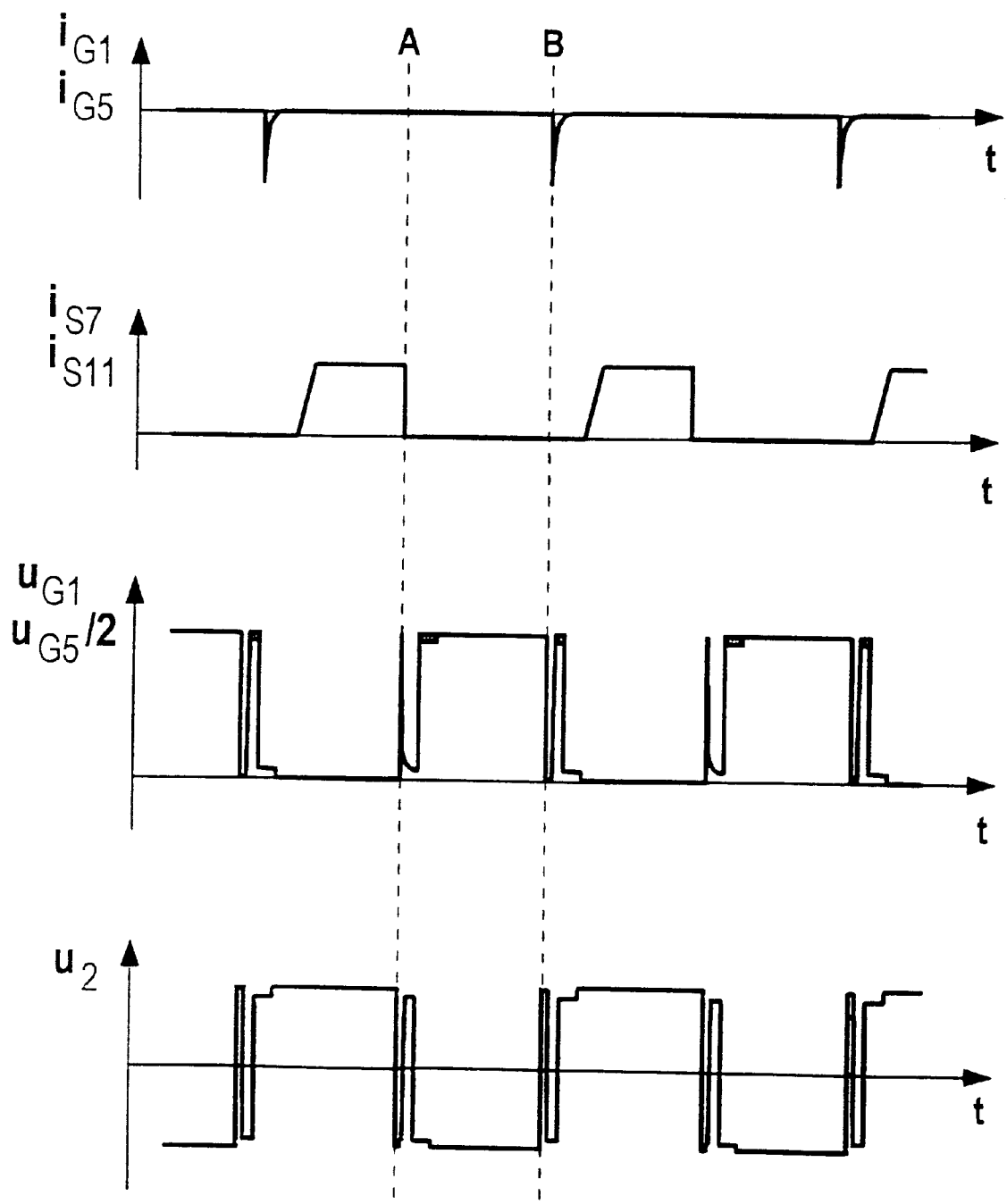

The voltage and current curves in FIG. 9 illustrate the feedback operation of the rectifier 26. In the feedback operation, by means of a feedback from the gradient coil 16 into the corresponding DC-voltage intermediate circuit, the DC-voltage $u_3$ has exceeded the value which it would have by means of the rectification of the AC-voltage $u_2$. No more current flow is then created by the rectification of $u_2$. Accordingly, as shown in the first line of FIG. 9, most of the time no current $i_{G1}$ (or $i_{G5}$) flows through the rectifier diode G1 (or G5). With each switch-off of the switch element S8 (or G5 as a recovery diode for S12), however, a current peak arises, since the rectifier diode G1 then acts as a recovery diode for the switch element S8 (or S12). The switch-off time for S8 (or, respectively, S12) is designated "B" in FIG. 8 and in FIG. 9.

The current $i_{S7}$ (or $i_{S11}$) through the switch element S7, (or S11) builds up after the switch-on of the switch element S7 (or S11) and quickly falls to zero with the switch-off (second line FIG. 9). The rectifier diode G2 (or G6) thus functions as a recovery diode. The time of the switch-off of S7 (or S11) is designated "A" in FIG. 9.

While the switch element S7 (or S11) conducts, the voltage $U_{G1}$ equals approximately zero (third line of FIG. 9). In the switch-off of S7 (or S11) at time A, the voltage $u_{G1}$ (or $u_{G5}$) rises through leakage inductances in the transformer T1 until the voltage $u_{G1}$ (or $u_{G5}$) is limited to the value of $u_3$ through the rectifier diode G2 (or G6). If the safety time $T_{S1}$ is long enough, then $u_{G1}$ (or $u_{G5}$) can become very small again; however, it cannot become zero, since $u_3$ is somewhat larger than the rectified value of $u_2$. Following the expiration of safety time $T_{S1}$, the level change of $u_2$ ensues, and following another safety time, the switch element S8 (or S12) is switched on.

While the switch element S8 (or S12) is switched on, $u_{G1}$ (or, respectively, $u_{G5}$) reaches the value of $u_3$. As already explained, the rectifier diode G1 (or G5) acts as a recovery diode in the switch-off of S8 (or S12), i.e. at time B. Through the conducting diode G1 (or G5), the voltage $u_{G1}$ (or $u_{G5}$) is zero for a short time. If the corresponding safety time is long enough, the voltage $u_{G1}$ (or $u_{G5}$) can then rise again almost to the value of $u_3$.

As can be seen from the last line of FIG. 9, the voltage $u_2$ arising in the feedback operation has an additional switch voltage peak before each switch-over edge. These voltage peaks arise due to the reactance of the voltage peaks of $u_{G1}$ (or $u_{G5}$) to $u_2$. During the closed circuit conditions of the switch element S7–S12, the voltage $u_2$ rises to the value of $u_3$.

From a comparison of the directions of $i_{G1}$ (or $i_{G5}$) in normal operation (last line of FIG. 8) and $i_{S7}$ (or $i_{S11}$) in feedback operation (second line of FIG. 9), it is clear that in the feedback operation, the energy flow is reversed relative to the normal operation. The respective energy flow direction arises according to the amplitude of the voltages $u_2$ and $u_3$. A stabilizing or measurement of $u_2$ or $u_3$ is not necessary. If one of the switch elements S7–S12 is continuously switched on, or if sufficient safety times are not maintained, this immediately results in a secondary short of the transformer T1.

In the exemplary embodiment depicted in FIG. 3, the drive circuit 32, which is designed as a single assembly, creates the drive signals not only for the switch elements S1–S4 of the flow converter 24, but also for the switching stages 30, 30', 30" for the rectifiers 26, 26', 26". It is thereby possible to create all these signals in a perfectly phase-coordinated manner and with minimal safety times, so that the DC-voltage $u_3$ is especially stable.

Figure 10:
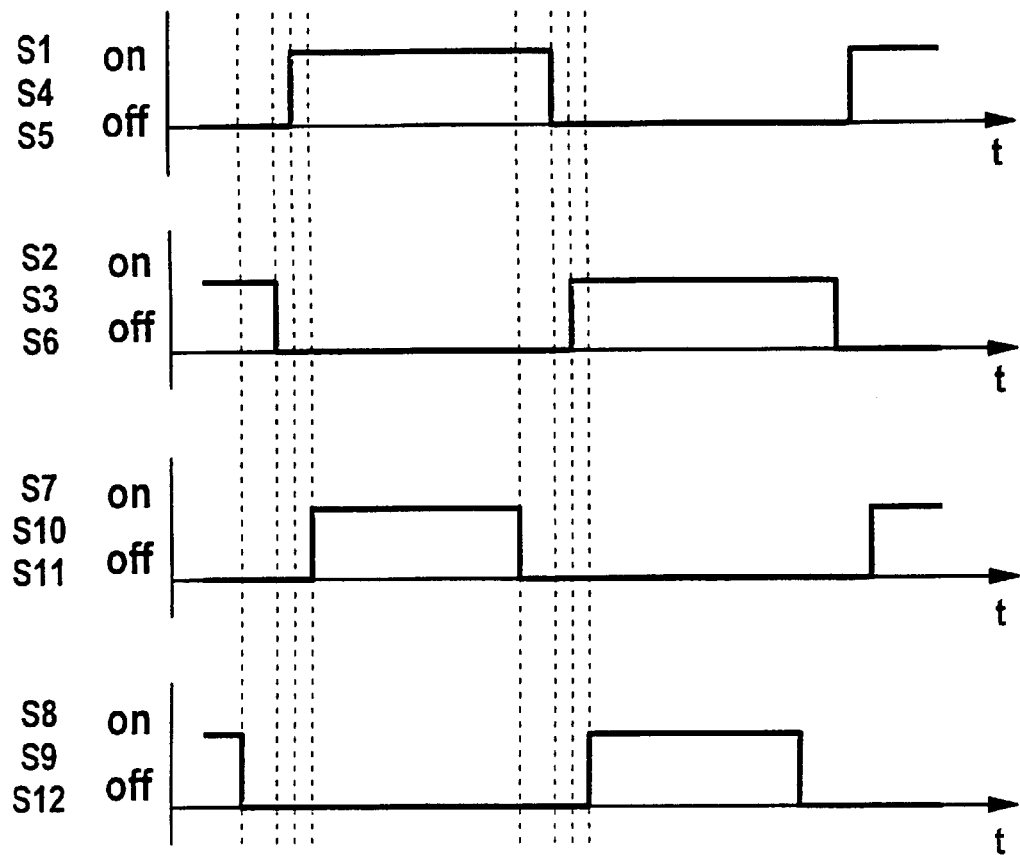
FIG. 10 shows voltage time-diagrams of drive signals for operating the embodiment of FIG. 3.

FIG. 10 depicts the four switching signals generated by the drive circuit 32, namely a first drive signal for the switch elements S1, S4 (or S5), a second drive signal for the switch elements S2, S3 (or S6), a third drive signal for the switch elements S7, S10 (or S11), and a fourth drive signal for the switch elements S8, S9 (or S12). The first two drive signals are symmetrical, rectangular signals shifted 180° toward each other, with dead times separating their switch-on phases. The third drive signal corresponds to the first drive signal; however, additional safety times are therein inserted at the beginning and at the end of the switch-on phases. The fourth drive signal can likewise be derived from the second drive signal by insertion of safety times.

In the feedback mode, a very high current can build through the switch elements S7–S12, given very long switch-on phases of the switching stages 30, 30', 30". To prevent an overload of the switch elements S7–S12, in one embodiment the drive circuit 32 is designed so that it extends the safety times beyond the necessary minimum. With the duration of the switch-on phases thus shortened, the maximum feedback current is also reduced.

Figure 11:
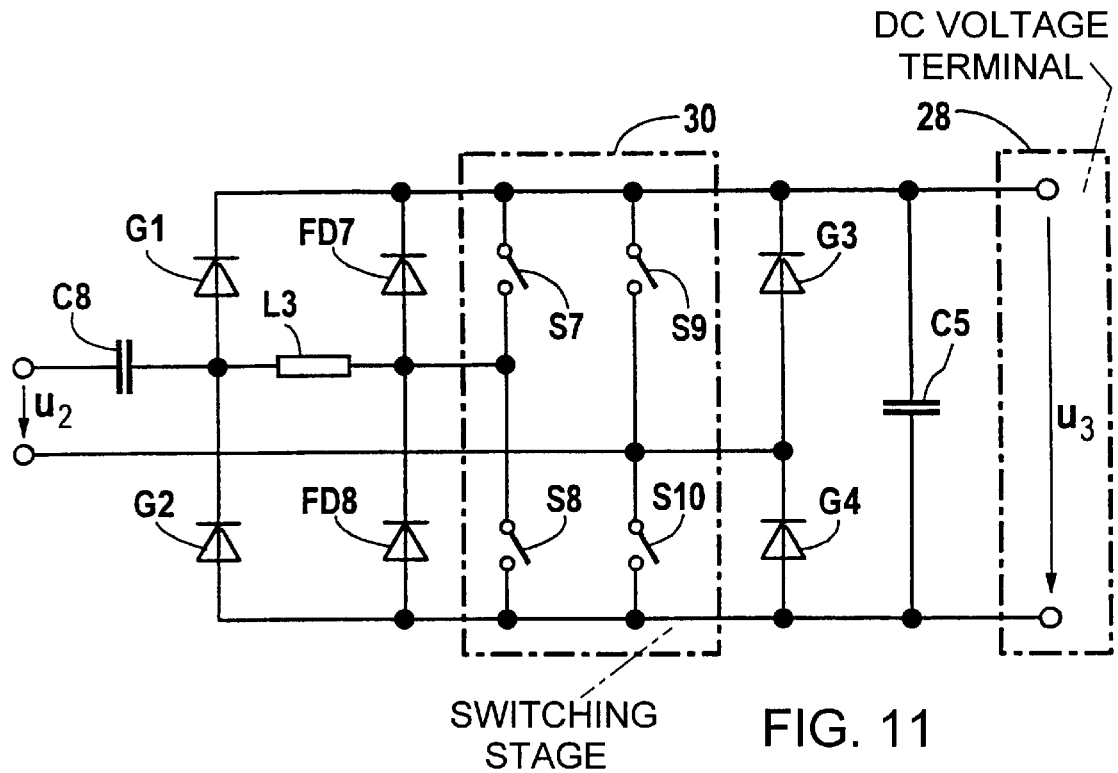
FIG. 11 and FIG. 12 are circuit diagrams of alternative exemplary embodiments of the rectifier embodiments according to FIG. 6 and FIG. 7 respectively.

The embodiment of the rectifier 26 depicted in FIG. 11 is based on the circuit in FIG. 6, however, the switch elements S7, S8 therein are connected to the rectifier diodes G1, G2 and to the coupling capacitor C8 via an inductance L3 designed as an inductor. Recovery diodes FD7, FD8 are further provided for the switch elements S7, S8, these recovery diodes FD7, FD8 being connected directly to these switch elements S7, S8. Due to the inductance L3, the rectifier diodes G1, G2 (in contrast to the circuit according to FIG. 6) can no longer serve as recovery diodes for the switch elements S7, S8 to an adequate degree.

In the normal operation, the circuit according to FIG. 11 (and, likewise, that according to FIG. 6) functions as rectifier for the AG-voltage $u_2$. In the feedback mode, the rapidity of the rise of the feedback current is lowered by the leakage inductance of the transformer T1, and additionally by the inductance L3 which is switched into the feedback branch. Otherwise, this circuit functions as the circuit according to FIG. 6.

Figure 12:
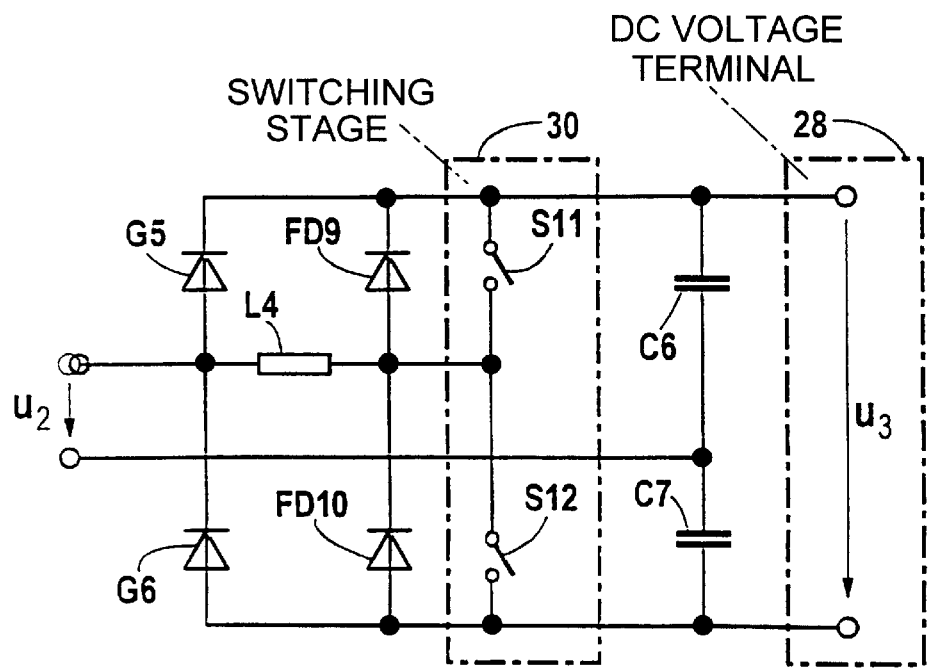

FIG. 12 depicts a corresponding expansion of the circuit according to FIG. 7. An inductance L4 also serves therein to reduce the feedback current, whereby additional recovery diodes FD9, FD10 are required for the switch elements S11, S12.

In the circuits according to FIG. 11 and FIG. 12, the power pack is stable in the normal operation; i.e. the voltage $u_3$ caries little under stress. In the feedback mode, however, the power pack has a "soft" characteristic due to the low feedback current. A single loading of the capacitors C5, or C6, C7, leads to a longer lasting feedback current with a lower amplitude. In contrast thereto, a power pack with a rectifier according to FIG. 6 or FIG. 7 is also stable in the feedback operation; that is, a single loading of the capacitors C5, or C6, C7 produces a short-lived feedback current with a high amplitude.

In another alternative, the drive circuit 32 is not provided as a central unit of the AC-voltage source 20 (as in FIG. 3), but instead is formed by a number of separate assemblies. These assemblies are structurally allocated to respective rectifiers 26, 26', 26" and need not communicate with each other nor with the flow converter 24. In each rectifiers 26, 26', 26", the information about the switching time of the switching stage 30, 30', 30" is derived from the curve of the voltage $u_2$, $u_2'$, $u_2"$. Since this voltage curve is different in normal and feedback modes (cf. FIG. 8, first line and FIG. 9, last line), an appropriate filtering means for the voltage $u_2$, $u_2'$, $u_2"$ is necessary. Besides this, long safety times must be maintained.

Figure 13:
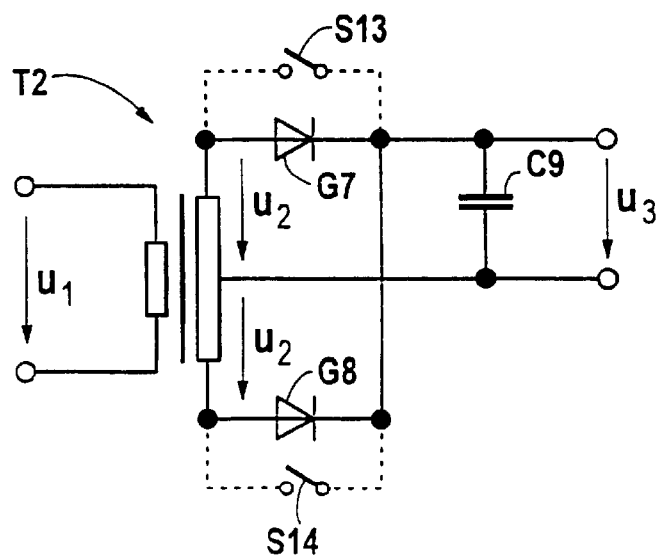
FIG. 13 is a circuit diagram of another rectifier in accordance with the invention.

In another variation, the rectifiers 26, 26', 26" are constructed according to the circuit depicted in FIG. 13 (full-wave rectifier with mid-point tapping). This circuit has a transformer T2 with a secondary winding with a free tap. Two rectifier diodes G7, G8 are connected with the end terminals of the secondary winding, and with a terminal of a capacitor C9. The other terminal of the capacitor C9 is connected to the tap of the secondary winding. Switch elements S13, S14 are provided parallel to the rectifier diodes G7, G8. Unlike in the circuits according to FIG. 6 and FIG. 7, however, the rectifier diodes in FIG. 13 do not function as recovery diodes for the switch elements S13, S14. An appropriate attenuation means is thus necessary for the protection of the switch elements S13, S14 againstover-voltages, this attenuation means can be formed by RC-networks, for example.

At present, the inventors view a power supply according to FIG. 3, FIG. 4 and FIG. 11 with drive signals according to FIG. 10 as the best mode of the invention.

Although modifications and changes may be suggested by those skilled in the art, it is the intention of the inventors to embody within the patent warranted hereon all changes and modifications as reasonably and properly come within the scope of their contribution to the art.

We claim as our invention:

1. A power supply comprising:
    an AC voltage source;
    a plurality of rectifier stages each having a DC voltage terminal, said rectifier stages being fed, in normal operation, by said AC voltage source and producing respective DC voltages at the respective DC voltage terminals;
    a plurality of output stages respectively connected to said DC voltage terminals of said rectifier stages;
    at least one of said rectifier stages containing switching means for, in an energy feedback mode, feeding energy back to said AC voltage source from the DC voltage terminal of the rectifier stage containing the switching means; and
    said AC voltage source comprising means for receiving energy fed back from said rectifier stage containing said switching means and for conducting said energy to at least one other of said rectifier stages.

2. A power supply as claimed in claim 1 wherein said at least one rectifier stage containing said switching means also includes a capacitor connected across the DC voltage terminal thereof, and wherein said switching means comprises means for feeding back energy from at least one of said DC voltage terminal and said capacitor of said rectifier stage containing said switching means.

3. A power supply as claimed in claim 1 wherein said AC voltage source contains a capacitor, and wherein said AC voltage source comprises means for conducting the fed back energy to at least one of said other one of said rectifier stages and said capacitor of said AC voltage source.

4. A power supply as claimed in claim 1 wherein each of said rectifier stages comprises at least one rectifier diode and wherein said switching means contains an active switch element connected in parallel with said at least one rectifier diode.

5. A power supply as claimed in claim 4 wherein said active switch element and said at least one rectifier diode are connected directly together in parallel.

6. A power supply as claimed in claim 4 wherein at least one rectifier diode and said active switch element are connected in parallel through an inductance.

7. A power supply as claimed in claim 4 further comprising drive means for activating said switching means at predetermined times for enabling feedback of said energy through said switching means in said feedback mode.

8. A power supply as claimed in claim 7 wherein said drive means comprises means for placing said active switch element in a conductive state at most at times at which a voltage originating in said AC voltage source corresponds in polarity to a conductive direction of said rectifier diode connected across said active switch element.

9. A power supply as claimed in claim 8 wherein said drive means comprises means for placing said active switch element in a conductive state for an entirety of said times at which said voltage originating in said AC voltage source corresponds in polarity to the conductive direction of the rectifier diode connected across said active switch element, except for respective safety times at a beginning and an end of said times at which the voltage originating in the AC voltage source corresponds in its polarity to the conductive direction of the rectifier diode connected across the active switch element.

10. A power supply as claimed in claim 9 wherein said drive means comprises means for adjusting said safety times for limiting excessive energy back flow through said switching means.

11. A power supply as claimed in claim 4 wherein each rectifier diode comprises a recovery diode for the active switch element connected thereto.

12. A power supply as claimed in claim 1 further comprising drive means for activating said switching means at predetermined times for enabling feedback of said energy through said switching means in said feedback mode.

13. A power supply as claimed in claim 12 wherein said drive means comprises means for activating said switching means at freely selectable predetermined times.

14. A power supply as claimed in claim 1 wherein said AC voltage source comprises means for producing a plurality of isolated AC voltages respectively for said rectifier stages.

15. A power supply as claimed in claim 9 wherein said AC voltage source comprises a transformer having a plurality of secondary windings, with said isolated AC voltages being respectively across said secondary windings.

16. A power supply as claimed in claim 1 wherein said AC voltage source comprises a public utility network input switch and a flow converter connected thereto.

17. A power supply as claimed in claim 16 wherein said switching means comprises a plurality of switching means switch elements and wherein said flow converter comprises a plurality of flow converter switch elements, and said power supply further comprising drive means for producing switching signals for operating said switching means switch elements and said flow converter switch elements in synchronization.

18. A power supply as claimed in claim 1 including a feedback path for said energy, said feedback path including at least one inductance for limiting excessive energy flow through said switching means.

19. A power supply comprising:
    an AC voltage source containing AC voltage source capacitor;
    a plurality of rectifier stages each having a DC voltage terminal and a rectifier stage capacitor, said rectifier stages being fed, in normal operation, by said AC voltage source and producing respective DC voltages at the respective DC voltage terminals;
    a plurality of output stages respectively connected to said DC voltage terminals of said rectifier stages;
    at least one of said rectifier stages containing switching means for, in an energy feedback mode, feeding energy back to said AC voltage source from the DC voltage terminal and the rectifier stage capacitor of the rectifier stage containing the switching means; and
    said AC voltage source comprising means for receiving energy fed back from said rectifier stage containing said switching means and for conducting said energy to at least one of said AC voltage source capacitor and at least one other of said rectifier stages.

* * * * *